United States Patent [19]

Toda et al.

[11] Patent Number: 5,323,358
[45] Date of Patent: Jun. 21, 1994

[54] CLOCK-SYNCHRONOUS SEMICONDUCTOR MEMORY DEVICE AND METHOD FOR ACCESSING THE DEVICE

[75] Inventors: Haruki Toda, Yokohama; Yuji Watanabe; Hitoshi Kuyama, both of Kawasaki; Shozo Saito, Yokohama, all of Japan

[73] Assignee: Kabushiki Kaisha Toshiba, Kawasaki, Japan

[21] Appl. No.: 24,354

[22] Filed: Mar. 1, 1993

[30] Foreign Application Priority Data

Mar. 19, 1992 [JP] Japan .................................. 4-063835
Dec. 22, 1992 [JP] Japan .................................. 4-341907

[51] Int. Cl.$^5$ .......................... G11C 7/00; G11C 8/00
[52] U.S. Cl. .................. 365/230.09; 365/219; 365/221; 365/240
[58] Field of Search ............... 365/233, 239, 240, 221, 365/219, 230.9, 230.3, 230.4

[56] References Cited

U.S. PATENT DOCUMENTS

| | | | |
|---|---|---|---|
| 4,891,794 | 1/1990 | Hush et al. | 365/189.4 |
| 5,018,110 | 5/1991 | Sugiyama et al. | 365/230.9 |
| 5,200,925 | 4/1993 | Morooka | 365/219 |

Primary Examiner—Eugene R. LaRoche
Assistant Examiner—Son Mai
Attorney, Agent, or Firm—Foley & Lardner

[57] ABSTRACT

A method for accessing a clock-synchronous semiconductor memory device including memory cells arranged in matrix. The cells are divided into at least two blocks, access to the cells in these blocks is designated from address data provided from an external device, and access to the memory cell is executed synchronously with an externally-supplied clock signal, which comprises setting the other blocks in an access preparation state or in an access operation standby state while one block is in an access operating state, setting a certain block in the access operating state via the access preparation state when the certain block is designated for the access operation by the address data and if the certain block is in the access operating state, and setting a certain block in the access operating state immediately when the certain block is designated for the access operation by the address data and if the certain block is in the access preparation state or in the access operation standby state. In the device, the designation of the cell in the block to be accessed is set using address data designating a block externally-provided from outside of the device.

9 Claims, 10 Drawing Sheets

CLOCK-SYNCHRONOUS SEMICONDUCTOR MEMORY DEVICE AND METHOD FOR ACCESSING THE DEVICE

BACKGROUND OF THE INVENTION

1. Field of the Invention

The present invention relates to a semiconductor memory device which operates synchronously with a basic clock signal, and, in particular, to a clock-synchronous semiconductor memory device wherein data can be input and output at high speed, and to a method for accessing this device.

2. Description of the Prior Art

The inventors of the present invention have previously proposed (Japanese Patent Application No. 3-255354) a semiconductor memory device, wherein, an address is input at a specific cycle of the basic clock signal synchronized with a basic clock signal supplied to the system, and then input and output of data commences after a specific number of cycles, counted from this specific cycle.

In the operation of this semiconductor memory device, a cycle in which no data is output extends from the provision of a row address until the output of the data. Accordingly, during the output of data synchronized with the clock signal, for example, when the row address is changed, a cycle is produced in which no data is output. This cycle is explained below in detail. Also, in the case of a column address as well, it is not appropriate that the column address be changed frequently and random access characteristics be provided.

This point will now be explained in detail. In the make-up of a memory cell array of a semiconductor memory, there is a matrix structure of rows and columns in which a plurality of memory cells are systematically arranged.

Generally, a series of cells related to a word line is selected from a row address, and the data from one cell in the selected word line is selected from a column address.

For this reason, the time required from deciding the row address until the output of the data must be longer than the time required from deciding the column address until the output of the data. Therefore, when a new row address is set during the output of a series of data items synchronized with the clock signal, time is required for accessing the row with the new row address. As a result, the clock-synchronous data output is interrupted. This is referred to as a cycle in which no data is output.

In particular, with a DRAM, precharge time is always necessary prior to the access of a new row address, therefore, the output of individual items of data is interrupted for a long time.

FIG. 1 is a chart specifically showing this cycle in which no data is output. In the chart, first, the memory access is commenced at a specific column in a memory cell group by the provision of a row address (CLK1) when a row enable control signal/RE is at a low level in the cycle, and the provision of a column address (CLK3), for example, at the second cycle following this cycle, when a column enable control signal/CE is at a low level in the cycle. This data passes through several cycles until output by data transfer to an external circuit becomes possible, for example, at the fourth cycle after the column address has been provided (CLK7). In FIG. 1, the Dout signals are output.

Following this, data is output at each cycle according to a predetermined order. Cell data designating a string of data after the row address has been provided, is related to the row address provided at the beginning. This takes some time in a DRAM because the cell data is sensed by access from a row address and is held in a sense amplifier, but because only the data held in the sense amplifier is read out by access to the column address, the read-out can be accomplished in a comparatively short time. In the case where the control signal/RE is at the "L" level and a new row address is set, the data held in the sense amplifier up to this time is reset, and a sense-related precharge is required to sense the new row data.

After this precharge has been carried out, a sensing operation is performed and new column data is held in the sense amplifier. During the term of the precharge for the row which is newly designated, data related to the previous row address is collected in the output register, and the read-out portion can be continuously output.

However, after the output of this part is completed, the output operation is halted because the data to be output is no longer prepared. As shown on the chart, data output can be continued up to the third cycle (CLK15) following the cycle in which the new row address is set (CLK12). In this example, in data output of the new row address, a space for two cycles (CLK16 and CLK17) of data output is produced because a minimum of six cycles has elapsed.

As can be understood from the foregoing explanation, when the designation of the row address is changed in a conventional clock-synchronous semiconductor memory device, the output of data synchronized with the clock signal is interrupted, resulting in the problem that the clock-synchronous memory function cannot be fully demonstrated.

In addition, data is output for a change in the column address, as shown in FIG. 2, and, in the clock-synchronous semiconductor memory device disclosed by the inventor of the present invention (see FIG. 3) one string of data is transmitted as a package from a memory cell group 32 to a serial register 37 so that it is not possible to arbitrarily modify the column address within the required cycle in outputting data of the length of the serial register 37. Specifically, in this case, access of the serial register 37 is normally carried out in a fixed order for high speed access of the memory cell, and it becomes possible to determine the first part of the access of the register 37 only during a bulk transmission of data to the register 37.

Accordingly, the feature of random accessibility of as many bits as possible of the serial register 37 disappears at that column.

SUMMARY OF THE INVENTION

Accordingly, an object of the present invention is to provide, with due consideration to the drawbacks of such conventional methods, a system wherein the creation of a cycle in which no data is output synchronized with the clock cycle is prevented when the row address is changed. As it is found in a conventional clock-synchronous access method, and also wherein clock-synchronous access is possible by newly changing a column address relative to the row address, without depending on the length of a serial register for output, a cycle is determined by only the time required for data transmission within the memory cell.

In accordance with one preferred embodiment, there is provided a method for accessing a clock-synchronous semiconductor memory device comprising a plurality of memory cells arranged in a matrix, the memory cells are divided into at least two blocks, access to the memory cells in these blocks is designated from address data provided from an external device, and access to the memory cell is executed synchronously with an externally-supplied clock signal, which comprises:

Setting the other blocks in an access preparation state or on an access operation standby state while one block is in an access operating state;

setting a certain block in the access operating state via the access preparation state when the certain block is designated for the access operation by means of the address data and if the certain block is in the access operating state; and setting a certain block in the access operating state immediately when the certain block is designated for the access operation by means of the address data and if the certain block is in the access preparation state or on the access operation standby state, wherein the designation of the memory cell in the block to be accessed is set using address data designating a block externally-provided from outside of the semiconductor memory device.

In accordance with another preferred embodiment, there is provided a method for accessing a clock-synchronous semiconductor memory device comprising a plurality of memory cells arranged in a matrix, the memory cells are divided into at least two blocks, access to the memory cells in these blocks is designated from address data provided from an external device, and access to the memory cell is executed synchronously with an externally-supplied clock signal, which comprises:

setting the other blocks in an access preparation state or on an access operation standby state by indicating from outside of the semiconductor memory device while one block is in a access operating state; and setting a certain block in the access operating state immediately when the certain block is designated for the access operation by means of the address data and if the certain block is in the access preparation state or on the access operation standby state, wherein the designation of the memory cell in the block to be accessed is set by using address data designating a block externally-provided from outside of the semiconductor memory device.

According to another preferred embodiment, there is provided a method for accessing a clock-synchronous semiconductor memory device comprising a plurality of memory cells arranged in a matrix, the memory cells are divided into at least two blocks, access to the memory cells in these blocks is designated from address data provided from an external device, and access to the memory cell is executed synchronously with an externally-supplied clock signal, which comprises:

setting the other blocks in a precharged state or in a precharging state while one block is being accessed;

setting a certain block in an access state when the certain block is designated by the address data and if the certain block has been in the access state after the precharge is performed for the certain block, or setting the certain block in the access state immediately when the certain block is designated from the address data and if the certain block has been in the precharged state; and starting a precharge for the other block which has been in the access state when one block is newly set in the access state, wherein the memory cell to be accessed is selected using one part of the address data.

According to yet another preferred embodiment, there is provided a method for accessing a clock-synchronous semiconductor memory device comprising a plurality of memory cells arranged in a matrix, the memory cells are divided into at least two blocks, access to the memory cells in these blocks is designated from address data input from external sources, and access to the memory cell is executed synchronously with an externally-supplied clock signal, which comprises:

setting the other blocks in a precharged state or in a precharging standby state indicating from outside of the semiconductor memory device while one block is being accessed; and setting the certain block in the access state immediately when the certain block is designated from the address data and if the certain block has been in the precharged state, wherein the designation of the block to be accessed is set using address data designating a block input from outside of the semiconductor memory device.

In accordance with another preferred embodiment, there is provided a clock-synchronous semiconductor memory device comprising:

memory means comprising a plurality of memory cells arranged in a matrix, said memory cells being divided into a plurality of blocks;

a plurality of registers used for data accessing between the memory means and an external device, which temporarily store one part of the accessed data;

scrambling means for selecting a part of the register used for storage of the accessed data;

scrambler control means for controlling the operation of the scrambling means by which the storage of the accessed data is stored cyclically in a prescribed order to the respective registers for each cycle of the clock signal; and an output means for carrying out interchanges of the accessed data between the registers and the external device, wherein the scrambler control means has the function of setting the selection ranking in the prescribed order of the scrambling means each time the head address is provided, to start the data access operation.

In accordance with another preferred embodiment, there is provided a method for accessing a clock-synchronous semiconductor memory device comprising a plurality of memory cells arranged in a matrix, wherein access of data to the memory cells is executed synchronously with an externally-provided clock signal, the memory cells are divided into at least two blocks, which comprises:

designating the memory cell to be accessed by row address data and column address data input from an external device, setting the other blocks in an access preparation state or on an access operation standby state while one block is in an access operating state;

setting a certain block in the access operating state via the access preparation state when the certain block is designated for the access operation by means of the address data and if the certain block is in the access operating state; or setting a certain block in the access operating state immediately when the certain block is designated for the access operation by means of the address data and if the certain block is in the access preparation state or on the access operation standby state;

designating the memory cell in the block to be accessed by using of specified bits in the address data designating a block externally-provided from outside of the semiconductor memory device;

storing one grouped access data temporarily into a plurality of the memory registers to carry out data access between the memory cells and the external device;

selecting the accessed data to be stored into the registers by a scrambling means;

controlling the scrambling means for the storage of accessed data cyclically in the prescribed order into the respective registers for each cycle of the clock signal by scrambler control means; and outputting and inputting for interchanges of data between the registers and the external device by an output means, wherein the selection ranking of the scrambling means is set in the prescribed order by the scrambler control means, each time the head address is provided, to start data access.

In accordance with another preferred embodiment, there is provided a method for accessing a clock-synchronous semiconductor memory device comprising a plurality of memory cells arranged in matrix, the memory cells are divided into at least two blocks, access to the memory cells in these blocks is designated from address data provided from an external device, and access to the memory cell is executed synchronously with an externally-supplied clock signal, which comprises:

setting the other blocks in an access preparation state or on an access operation standby state while one block is in an access operating state;

setting a certain block in the access operating state immediately when the certain block is designated for the access operation by means of the address data and if the certain block is in the access preparation state or on the access operation standby state, and setting of the designation of the memory cell in the block to be accessed using address data designating a block externally-provided from outside of the semiconductor memory device;

storing one grouped access data temporarily for carrying out data access between memory cells and an external device into a plurality of registers;

selecting the register for storing the access data by scrambling means;

controlling the scrambling means for the storage of access data cyclically in the prescribed order into the respective registers for each cycle of the clock signal by scrambler control means; and outputting and inputting for interchanges of data between the registers and the external device by an output means, wherein the selection ranking of the scrambling means is set in the prescribed order by the scrambler control means, each time the head address is provided, to start data access.

BRIEF DESCRIPTION OF THE DRAWINGS

These and other objects, features, and advantages of the present invention will become more apparent from the following description of the preferred embodiment taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

We will describe the basic concept or feature of the present invention first, then preferred embodiments in detail. In clock-synchronous semiconductor memory device and the method for accessing the clock-synchronous semiconductor memory device, each time a change is made in a portion of the bits for the row address as data for the address which designates a memory cell block, the designation for a memory cell block to be activated is changed, and during the output of data from the serial register of the previously activated memory cell block, the newly activated memory cell block is accessed, and thus preventing a cycle in which data is not output until all data is output from the row address. In other word, the present invention provides a semiconductor memory device in which output of individual items of data is not interrupted.

In addition, when data is stored in the serial register for output from the memory cell block, data is stored in each part of the structural elements of the register. At that time, by storing the data in the register in accordance with the data sequence determined according to the provided column address, the access sequence of the serial register is carried out in a normally fixed, relatively high speed operation, and frequent column address changes can also be adequately handled.

Embodiments of the present invention will now be explained with reference to the drawings.

Figure 1:
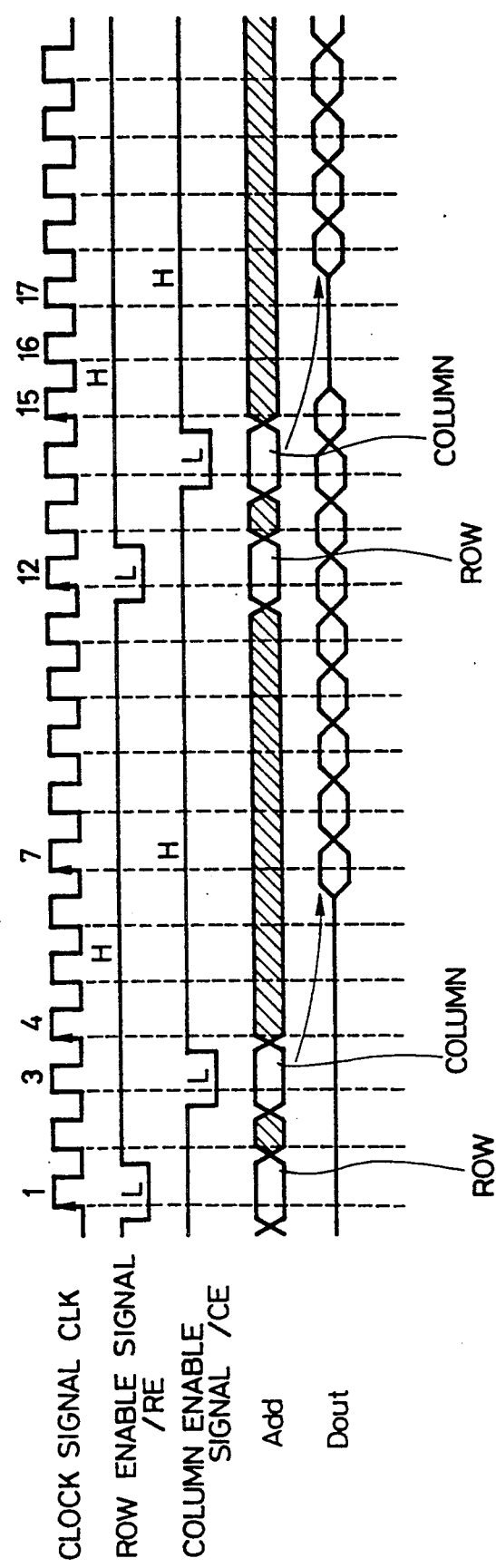
FIG. 1 is a timing chart showing the relationship between a row address setting of a conventional clock-synchronous semiconductor memory device and the output data.
Figure 2:
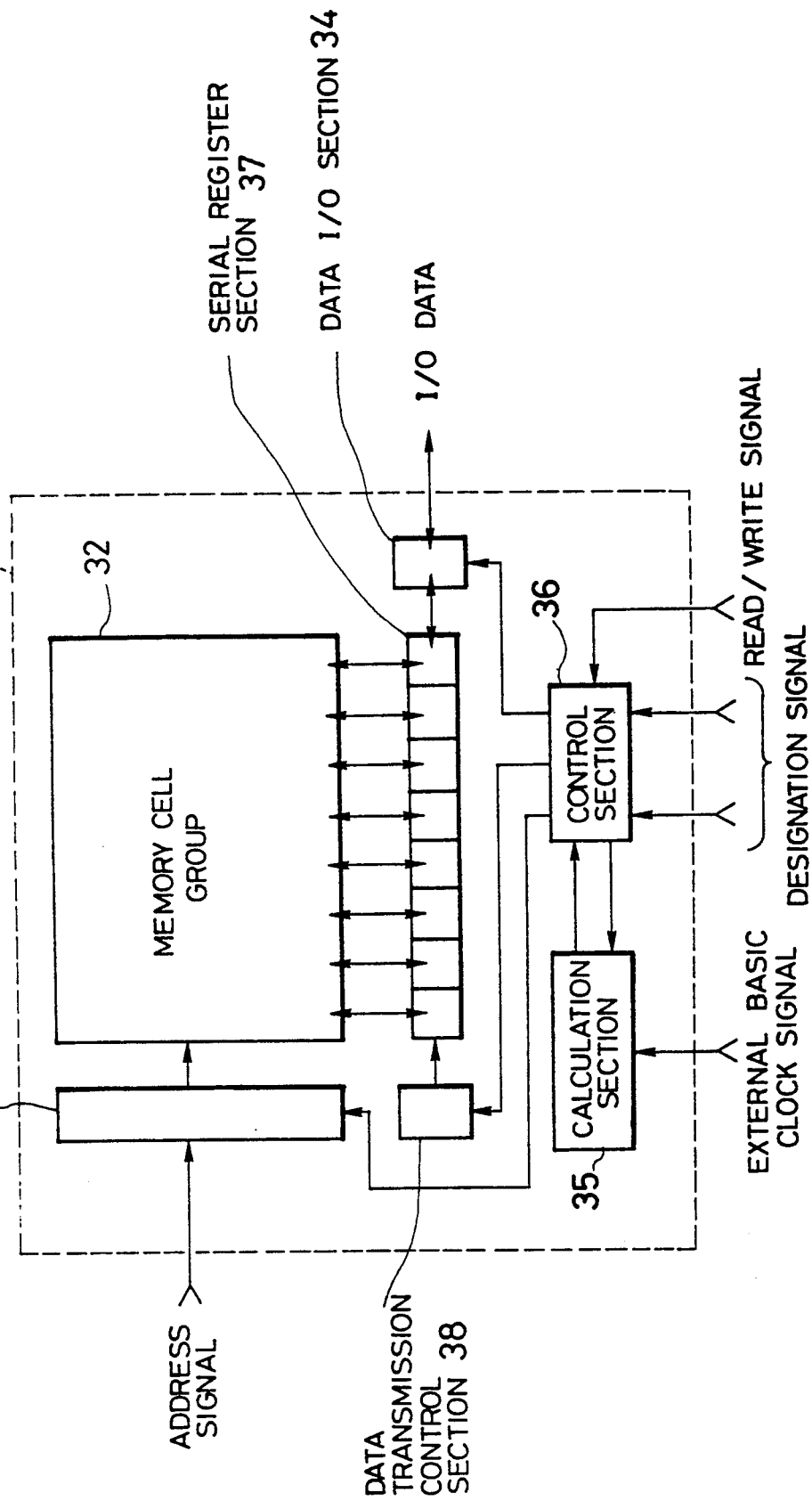
FIG. 2 is a block diagram for a conventional clock-synchronous semiconductor memory device.
Figure 3:
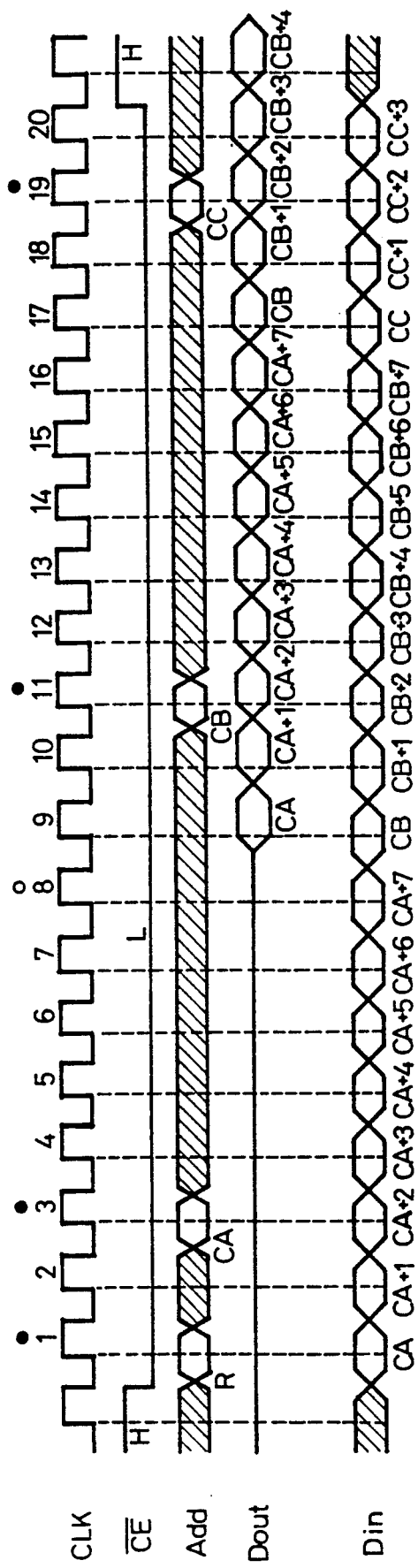
FIG. 3 is a timing chart showing the relationship between a column address setting of a conventional clock-synchronous semiconductor memory device and the output data.
Figure 4:
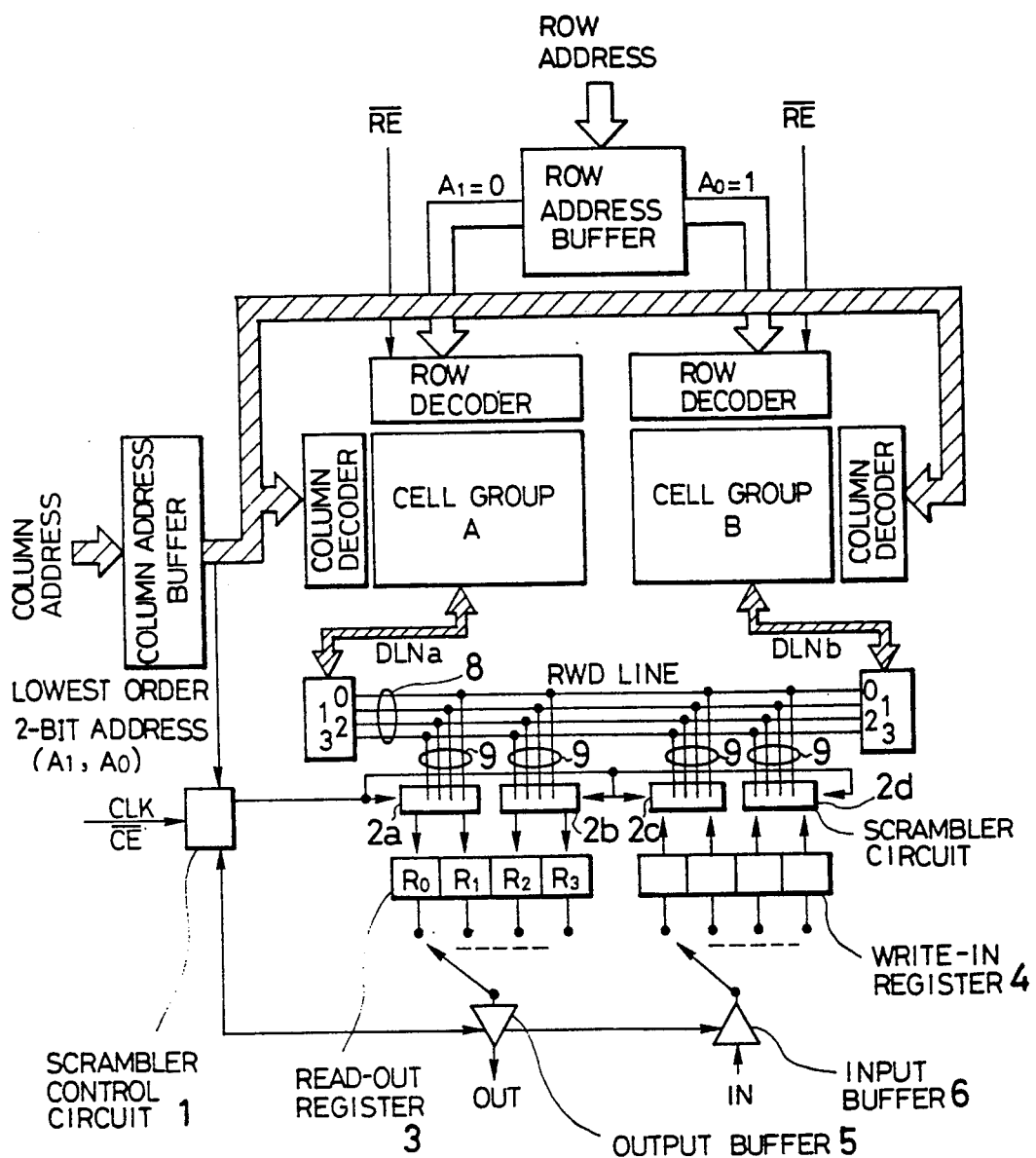
FIG. 4 is a block diagram for a clock-synchronous semiconductor memory device of the present invention.

FIG. 4 is a block diagram for a clock-synchronous semiconductor memory device of the present invention. In the diagram, a memory cell portion is divided into two block parts. A and B. The selection of the block part, for example, is performed by changing the value of the lowest order bit of a row address as address data designating the block.

When the row address is provided for the block cell groups A and B, an access operation is commenced for the block cell group corresponding to the value of the lowest order bit of this address, and if the other block cell group is not in the access standby state, it is put into the access standby state before an access operation. For example, in the case where a DRAM cell is used, a cell array precharge is always necessary prior to the access operation. But when access is commenced for the cell group which has already been put into the precharged state, precharge of the other cell group is commenced. Then, the next access for the other cell group is started via the access standby state.

Figure 5:
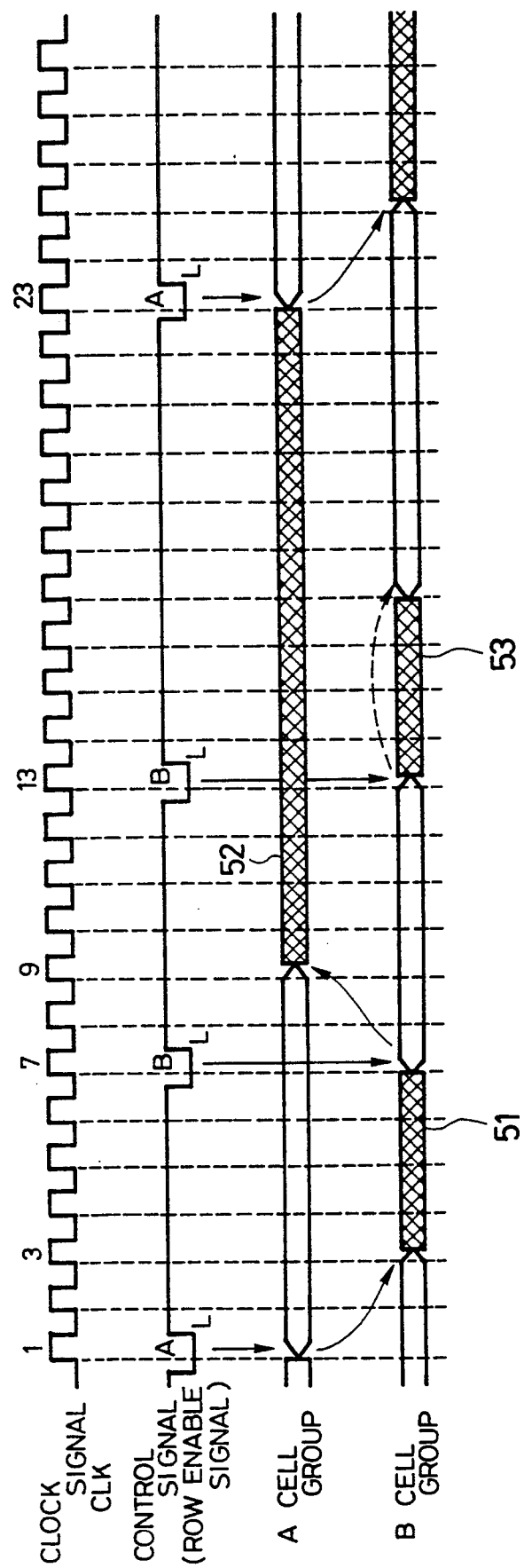
FIG. 5 is a timing chart for explaining the operation of a row address in the clock-synchronous semiconductor memory device shown in FIG. 4.

In addition, when the cell group which is not in the access standby state is selected, in the access operation for that cell group, first a precharge is started, and the access operation is started via the access standby state. FIG. 5 shows the operating conditions of this cell group. In the drawing, the cycles with a checkered pattern represent the preparation and standby time for the access operation. In FIG. 5, at each "L" level cycle (CLK1, CLK7, CLK13, CLK23) of a control signal Row Enable (/RE), the cell groups A and B are accessed in the sequence A, B, B, A. Two cycles after the cycle (CLK1) in which the cell group A is in the accessed state, the cell group B enters the access standby state (checkered pattern 51).

Next, two cycles after (CLK9) the group B has entered the accessed state (CLK7), the group A enters the access standby state (checkered pattern 52). Next, when the group B is once again accessed (CLK13), the group B immediately enters the access standby state (checkered pattern 53), and after the access operation is carried out in sequence the access standby state is achieved. Following this, the same manner of operation is repeated by using the combination of the value of the lowest order bit of a row address and the cell group access state.

Next, an access method will be considered for an access method other than the above-mentioned access method for accessing each cell group. For example, in the case where a row address is provided in the block cell groups A and B, if the block cell group corresponding to the bit value for block selection in this row address is in the access standby state, the access operation starts.

If the block cell group has already been in the access operation state, an operation is carried out disregarding access which must be implemented via the access standby state. Specifically, in order to enter the access standby state, the block cell group is designated by the address bit for block selection, and then an instruction signal is provided for setting the standby state. For example, in the case where a DRAM cell is used, when a block cell group which has already been precharged is selected the access operation immediately commences. Another block cell group is selected in a state in which a certain word line has been already selected, the cell block group which has been already sensed is selected, and if that selection instruction is to select another word line, the access operation is ignored. If the selection is for a cell related to an already selected word line, the read-out of data from that cell is commenced (according to a method which will be later explained).

Figure 10:
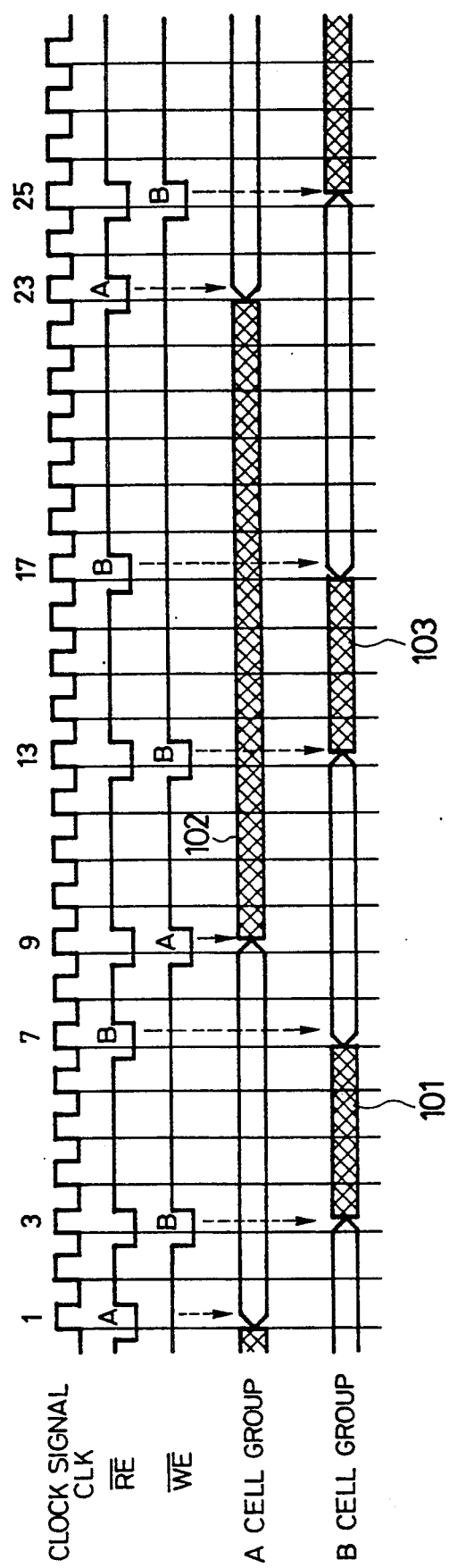
FIG. 10 is a timing diagram showing the operation and features of data output for the clock-synchronous semiconductor memory device of the present invention.

FIG. 10 is a timing chart showing the operating conditions of the cell group in such a case. An instruction signal to enter precharge occurs when the control signal/RE and a Write Enable signal/WE reach the "L" level simultaneously.

In the drawing, the cycles with the checkered patterns represent the preparation and standby time for the access operation, in the same manner as for the case of the embodiment shown in FIG. 5.

In the embodiment of FIG. 10, as in the embodiment of FIG. 5, at each "L" level cycle (CLK1, CLK7, CLK13, CLK23) of the control signal/RE, the cell groups are accessed in the sequence A, B, B, A. The embodiment of FIG. 10, in the same manner as an embodiment illustrated in FIG. 5, shows the timing of an input signal for entering the standby time for the access operation.

In CLK3, two cycles after the cycle (CLK1) in which the A group is in the accessed state, the control signal/RE and the write enable signal/WE are at the "L" level and the cell group B enters the standby state for the selected access operation (checkered pattern 101).

Next, because the block cell group A is in the access standby state (checkered pattern 102) after the group B has entered the accessed state (CLK7), the control signal/RE and the write enable signal/WE are at the "L" level (CLK9). Next, in order to once again access the block cell group B, the block cell group B is set in the access stand-by state (checkered pattern 103) by the control signal/RE and the write enable signal/WE goes to the "L" level (CLK13). At the cycle (CLK17) in which the access preparation for the block cell B is completed, the control signal/RE is at the "L" level and the access operation for the block cell B commences. Following this, the same manner of operation is repeated and the access operation is carried out.

As shown in FIG. 4, for example, four bits of data are read out, including two bits (A1,A0) in a column address provided from the cell group in the access state, into four RWD lines through a pair of data transmission lines DLNa, DLNb. In this case, the two bits (A1,A0) are input to a scrambler control circuit 1. These data items are read out two bits at a time and are transmitted to a register. The decision as to which two bits are transmitted is carried out by a plurality of scramblers 2a, 2b, 2c, 2d by reading out the state of the low order two bits (A1,A0) of a renewal-possible column address every two cycles from the data output state of the registers R0 to R3, based on a control signal output from the scrambler control circuit 1.

The data output from the registers R0 to R3 through an output buffer 5 is normally implemented by high speed data output by scanning the registers R0 to R3 in a fixed order.

The order of access of the registers R0 to R3 is normally fixed and a new column address is accessed so that data access can be started from an optional address, with data transmission of scrambled data to the registers R0 to R3. For this reason, it is possible to convert to high speed and to implement randomness for changing the head address at a cycle (in this case two cycles) determined only by the time to transmit data from the cell groups A, B.

Further, in this example, the data output from the cell groups A, B is transmitted in 4-bit units through the RWD lines 8. Therefore, in the address change for the serial access, the low order two bits (A1,A0) of the column address change to indicate the accessing order of the registers R0, R1, R2, and R3 composed of the readout register 3. These are, for example: 0, 1, 2, 3, or 1, 2, 3, 0, or 2, 3, 0, 1, or 3, 0, 1, 2, and the like. In relation to a write-in operation, data output using almost reversed procedures may be considered. Generally data is entered in a fixed order into a write-in register 4, passes through the scrambler circuits 2c and 2d by two-bits, and is transmitted to the cell groups A and B. At this time, a cluster of four bits can be transferred to the cell groups A and B, which is as same as for a read-out operation.

The data transmission method for a read-out operation will now be explained in further detail with reference to FIG. 6. Data read from a designated four columns simultaneously (for example A1) from the column address except for the lowest order two bits, is transmitted in parallel, and is held in four RWD lines 8 until the next data is transmitted.

In this data holding interval, two bits at a time of data are transmitted to a register (RG1, RG2) by the scramble operation by the register R0 to R3 presently being accessed and the head address of the data, and the like, and passing through a scrambler circuit 2a and 2b controlled by a signal generated from the scrambler control circuit 1.

Data is output continuously in a fixed order from the registers R0 to R3, by accessing the registers R0 to R3. As shown in the drawing, data is generally output to an exterior location from the registers cyclically in the order R0, R1, R2, R3, R0, . . . . Data is stored in the cyclically accessed registers R0 to R3, by passing through the scramblers 2a, 2b, but because data is stored in a pair of registers, it is possible to change the cyclic access of the head address during each storage occasion.

Further, the setting of the length of the register and the setting of the number of bits at a time collected for data storage can be decided based on the number of registers accessed until new data is transmitted in the RWD line 8. In this embodiment, optional four columns of data are transferred from the cell block to the RWD line within two cycles.

Figure 6:
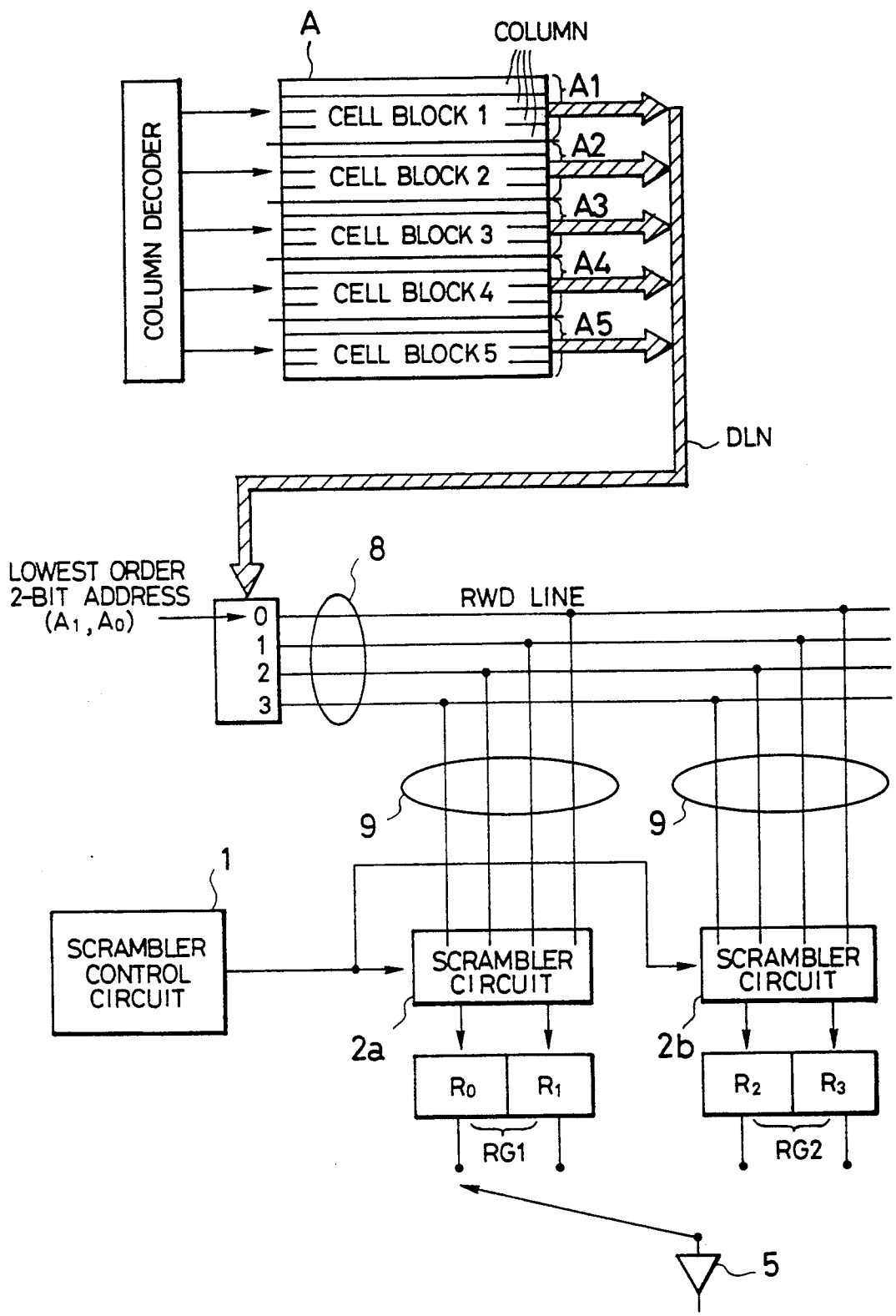
FIG. 6 is a block diagram for explaining in detail the data output mechanism in the clock-synchronous semiconductor memory device shown in FIG. 4.

In FIG. 6, only five cell blocks A1 to A5 arranged in four columns each are shown, but this of course could be any number, depending on the size of the memory.

The specific structure of the scramblers 2a to 2d, and the connections between the RWD line 8 and the registers R0 to R3 will be later outlined, but first the flow of data will be explained with reference to a timing chart.

Figure 7:
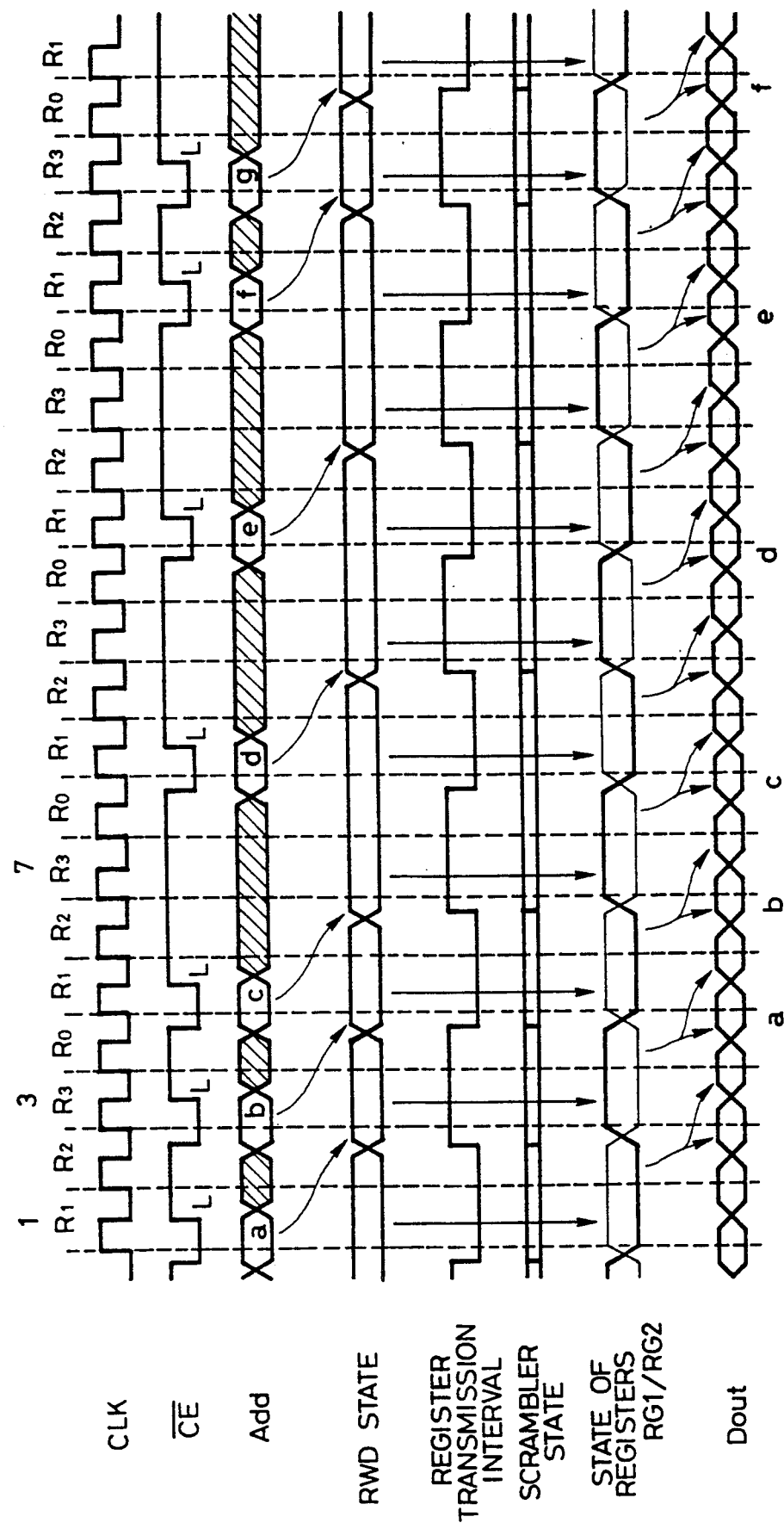
FIG. 7 is a timing diagram for explaining the operation for a column address shown in FIG. 6 in the clock-synchronous semiconductor memory device shown in FIG. 4.

FIG. 7 is a timing diagram showing the flow of data transmitted to each part of the registers R0 to R3 shown in FIG. 6 at each cycle of the basic clock signal.

The registers R0 to R3 are generally accessed in a fixed sequence at the onset of the basic clock signal. A change in the access head address is possible in the access start cycles for the registers R0 to R3 (for example, CLK1, CLK3).

As shown in FIG. 7, in these cycles the control signal /CE is at a "L" level, and a column address is entered which becomes the new head address. Shown as RWD STATE, an interval is illustrated in which data is latched into from 0 to 3 RWD line 8. After almost two cycles (CLK3) from the cycle (CLK1) in which the new address is set, new data is transmitted to the RWD line 8, and the state of the RWD lines is changed. In the case where a new address is not set (for example CLK7), the RWD lines 8 may continue to hold data. Also, at every fourth cycle from the setting of the last address a counter in the chip may automatically generate an address, and that address may be automatically incremented for the continuous data output.

In FIG. 7, the REGISTER TRANSMISSION INTERVAL shown is the interval during which data is transmitted to a pair of register groups RG1 and RG2 which are made up of two registers respectively. During a data load interval when the cycle is at the "H" level, data is transmitted to RG1; when at the "L" level, data is transmitted to RG2.

In FIG. 7, the SCRAMBLER STATE is shown below the REGISTER TRANSMISSION INTERVAL. The scrambler setting is held only for the time that a new address is not set.

In addition, when the address is incremented by the internal counter, no change in the scrambler state is produced. Specifically, the cluster of data to be transmitted to the RWD lines 8 is changed every next four columns, so that there is no change in sequence in the four bits of data output from the register.

Figure 8:
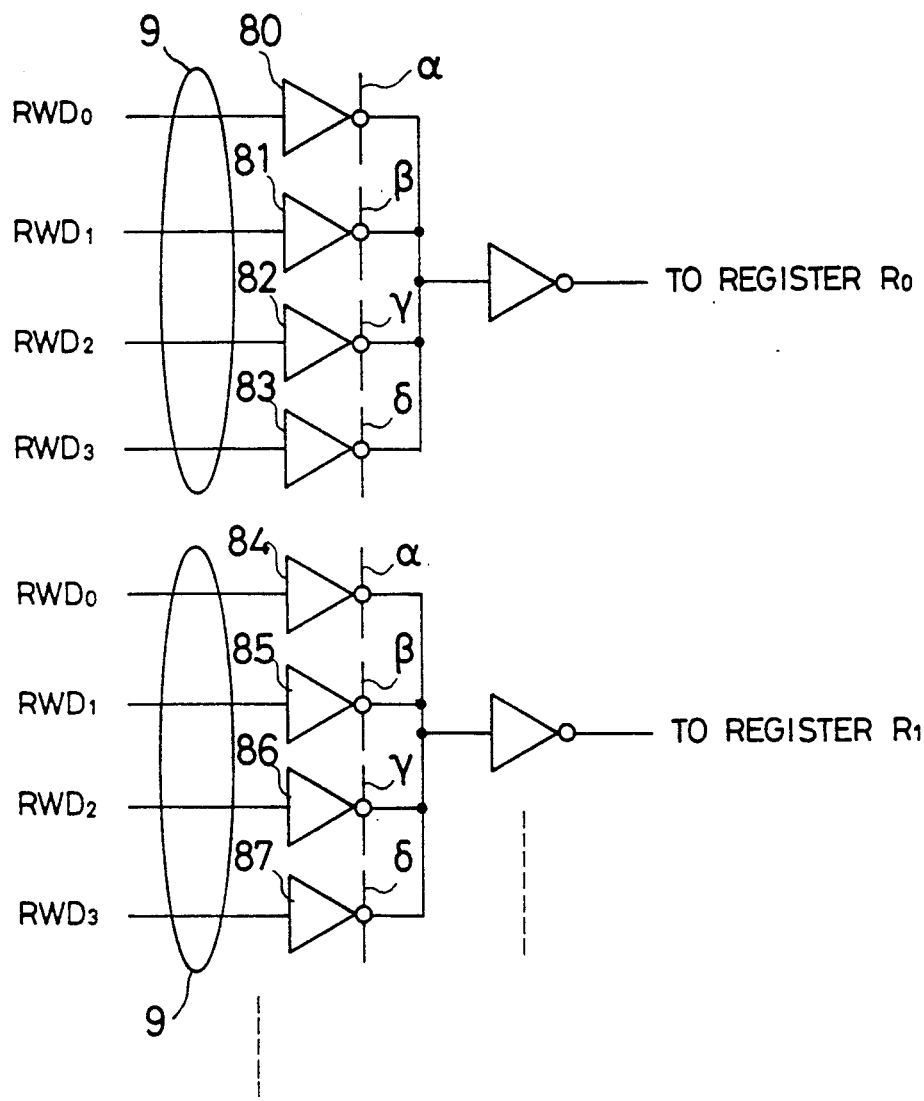
FIG. 8 is a specific circuit configuration diagram for a scrambler circuit shown in FIG. 6.

In the STATE OF REGISTERS RG1/RG2, the thick line shows the state of the register RG1 while the thin line shows the state of the register RG2. Data is entered into the register when the cycle is at the "H" level, and data is held when the cycle is at the "L" level. The held data is output to an external location as output data by cyclically accessing the register at each cycle. FIG. 8 is a specific circuit configuration diagram for the scramblers 2a to 2d.

The specific operation of the scramblers will now be explained with reference to this diagram. FIG. 8 shows four RWD lines 8 and a circuit for transmitting data to one register. In actual practice, the same number of circuits as that of the registers is provided to the clock-synchronous semiconductor memory device (omitted in FIG. 4 and FIG. 6). The signal input to the clocked inverter differs for each circuit. Table 1 shown below is a table of control signals input to clocked inverters 80 to 87 for the scramble circuit 2a. Clocked inverters for the scramble circuit 2b are omitted in FIG. 8. These signals $\alpha$, $\beta$, $\gamma$, $\delta$ have the function of inverting the clocked inverter 81 at the "H" level.

TABLE 1

|  |  | $\alpha$ | $\beta$ | $\gamma$ | $\delta$ |
|---|---|---|---|---|---|
| RG1 | R0 | a | b | c | d |
|  | R1 | d | a | b | c |
| RG2 | R2 | c | d | a | b |
|  | R3 | b | c | d | a |

In the above table 1, in the case of, for example, register R2, control signals correspond to characters a, b, c, d where $\alpha=c$, $\beta=d$, $\gamma=a$, and $\delta=b$. The signals a, b, c, and d for selecting the clocked inverters 80 to 87 are decided by the state whether the register group RG1 is accessed or the register group RG2 is accessed at the cycle which newly sets the head address and the two lowest order bits (A1,A0) in the column address of the newly set head address.

These a to d are the output of the scrambler control circuit. The following table 2 shows the logic for the output of the scrambler control circuit.

TABLE 2

|     | (A1, A0) |       |       |       |
|-----|----------|-------|-------|-------|
|     | (0,0)    | (0,1) | (1,0) | (1,1) |
| RG1 | c        | d     | a     | b     |
| RG2 | a        | b     | c     | d     |

In the above table, when, for example, the control signal /CE is at the "L" level and new column address is introduced, if the register group RG2 is at the cycle being accessed, and if the two lowest order bits (A1, A0) of the new column address are (0, 1), the character b in Table 2 only reaches "H" level. In this case, in Table 1, the character "b" in the row for the register R0 indicates the character "β". In FIG. 8, the data on the RWD1 line is selected and transferred to the register R0 because the clocked inverter 81 is activated.

These scrambler signals are set in the scrambler when the data selected by the address which sets the scramblers 2a, 2b, 2c, 2d enters the registers. In this example, R0 is connected to RWD1, the register R1 to RWD2, the register R2 to RWD3, and the register R3 to RWD0. The effect of the clock-synchronous semiconductor memory device with the system structure of the present embodiment will now be explained using FIG. 4 which is the total configuration drawing and FIG. 9 which is the operation timing chart. Specifically, the data output operation without interruption will be explained below in detail when the row and column addresses are changed.

Figure 9:
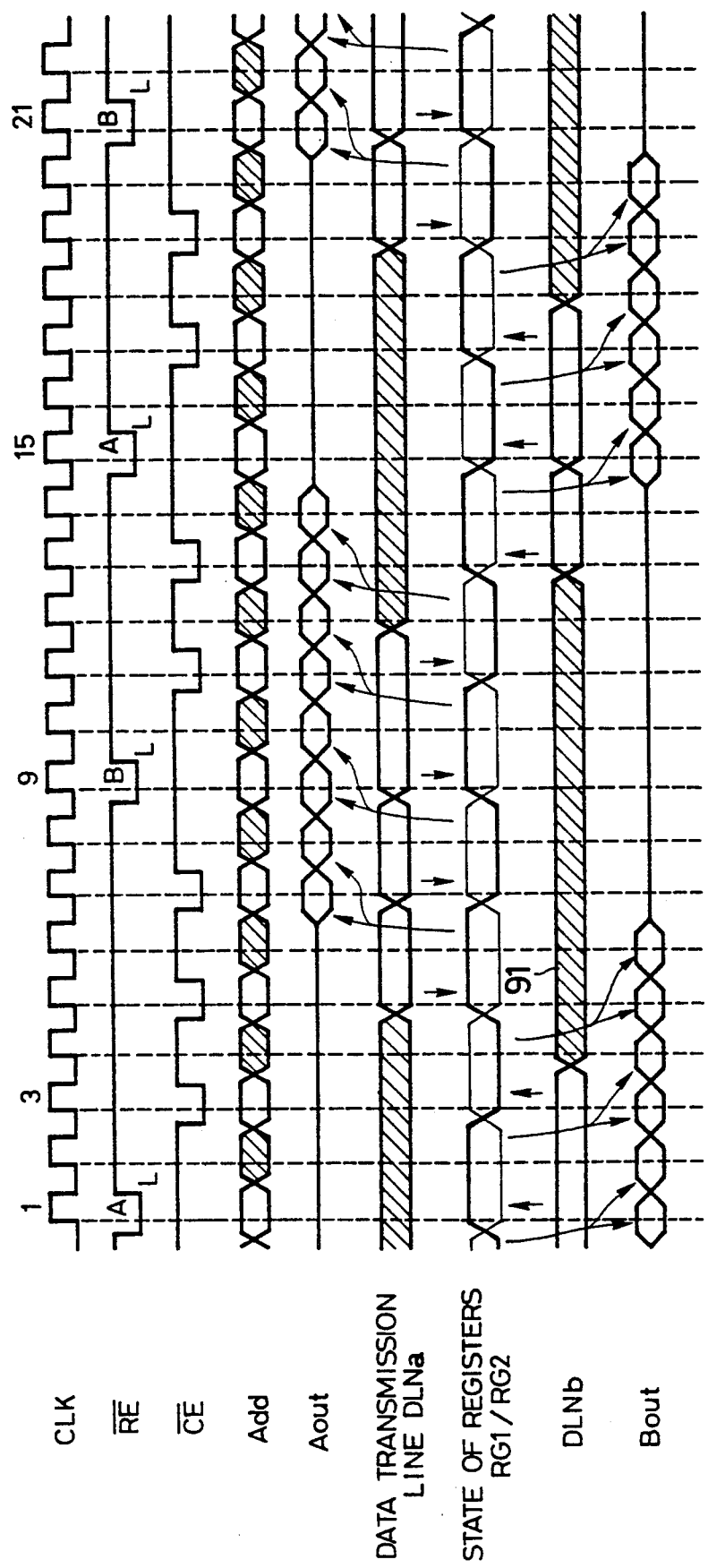
FIG. 9 is a timing chart for indicating the features and the operation of the data output in the clock-synchronous semiconductor memory device according to the present invention shown in FIG. 4.

The timing chart shown in FIG. 9 shows the data output (Aout, Bout) divided into the cell group A and the cell group B for convenience. In actual practice, the data is output from the same output buffer, so that data is output continuously at each cycle.

At the cycles (CLK1, 9, 15, 21) where the control signal /RE is at "L" level, the row addresses are set in the order A, B, A, B. Then, the head column address is also renewed every two cycles. Specifically, it will be assumed that as much randomness as possible is introduced into the column address.

First, at the second cycle (CLK 3) following the cycle (CLK1) in which the row address for the group A is set, the cell group B which is already being accessed commences a precharging operation. For this reason, the state of the data in the data transmission line DLNb from the cell group B is not yet confirmed.

This element is shown as a hatched area 91 in the chart. Data confirming the line DLNa or the line DLNb is held in the RWD line 8. The data held in the RWD line 8 is transmitted to the register and this transmitted data is the same as the data confirmed in the line DLNa or the line DLNb as shown in FIG. 9. In FIG. 9, the heavy lines used in the section labelled "STATE OF REGISTERS RG1/RG2" indicate the register group RG1, while the light lines indicate the register group RG2.

The "H" level for either of these indicates the interval during which data is being transmitted to the register. Accordingly, the data in the line DLNb is transmitted to the registers RG1 and RG2 until the cell group B is precharged. During the output of this data, the data from the cell group A is read out of the line DLNa and confirmed. This data is transmitted to the register RG1 from which data output has been completed.

When two cycles have elapsed, the data from the column determined by the next column address is confirmed in DLNa, and this data is transmitted to the register RG2 from which data output has been completed. Following this, transmission continues to the register in the same manner and data is output continuously.

During transmission of data to the register, as explained above, the scrambler control circuit 1 functions in accordance with the column address to output data to the register group and store this data in the register in a specified sequence. As outlined in the foregoing, it is possible by means of the system of the present invention to provide continuous transmission of data and memory which operates at a high speed cycle with random access as frequently as possible.

As can be understood from the above explanation, by means of the present invention, each time there is a change in a portion of the bits of the row address, the activated memory cell block changes and during the period that data from the previously activated memory cell block is being output from a serial register, by accessing a new memory cell block it is possible to eliminate a cycle in which no new data is output until the data is output from the row address.

In addition, it is possible to provide a semiconductor memory device for a clock-synchronous access method and to provide a method of accessing which can also cope with a serial register access sequence at a fixed, rather high speed and frequent row address changes, by storing this data in a sequence determined according to the provided column address, each time data is stored in one part of the register when data is stored in the serial register for output from the memory cell block.

What is claimed is:

1. A method for accessing a clock-synchronous semiconductor memory device comprising a plurality of memory cells arranged in matrix, the memory cells are divided into at least two blocks, access to the memory cells in these blocks is designated from address data provided from an external device, and access to the memory cell is executed synchronously with an externally-supplied clock signal, comprising the steps of:

setting the other blocks in an access preparation state or an access operation standby state while one block is in an access operating state;

setting a certain black in the access operating state via the access preparation state when the certain block is designated for the access operation by means of the address data and if the certain block is in the access operating state; and setting a certain block in the access operating state immediately when the certain block is designated for the access operation by means of the address data and if the certain block is in the access preparation state or on the access operation standby state, wherein the designation of the memory cell in the block to be accessed is set using address data designating a block externally-provided from outside of the semiconductor memory device.

2. A method for accessing a clock-synchronous semiconductor memory device comprising a plurality of memory cells arranged in matrix, the memory cells are divided into at least two blocks, access to the memory cells in these blocks is designated from address data provided from an external device, and access to the memory cell is executed synchronously with an externally-supplied clock signal, comprising the steps of:
  setting the other blocks in an access preparation state or on an access operation standby state by indicating from outside of the semiconductor memory device while one block is in an access operating state; and
  setting a certain block in the access operating state immediately when the certain block is designated for the access operation by means of the address data and if the certain block is in the access preparation state or on the access operation standby state,
  wherein the designation of the memory cell in the block to be accessed is set using address data designating a block externally-provided from outside of the semiconductor memory device.

3. A method for accessing a clock-synchronous semiconductor memory device comprising a plurality of memory cells arranged in matrix, the memory cells are divided into at least two blocks, access to the memory cells in these blocks is designated from address data provided from an external device, and access to the memory cell is executed synchronously with an externally-supplied clock signal, comprising the steps of:
  setting the other blocks in a precharged state or in a precharging state while one block is being accessed;
  setting a certain block in an access state when the certain block is designated by the address data and if the certain block has been in the access state after the precharge is performed for the certain block, or setting the certain block in the access state immediately when the certain block is designated from the address data and if the certain block has been in the precharged state; and
  starting a precharge for the other block which has been in the access state when one block is newly set in the access state,
  wherein the memory cell to be accessed is selected using one part of the address data.

4. A method for accessing a clock-synchronous semiconductor memory device comprising a plurality of memory cells arranged in matrix, the memory cells are divided into at least two blocks, access to the memory cells in these blocks is designated from address data input from external sources, and access to the memory cell is executed synchronously with an externally-supplied clock signal, comprising the steps of:
  setting the other blocks in a precharged state or in a precharging standby indicating from outside of the semiconductor memory device while one block is being accessed; and
  setting the certain block in the access state immediately when the certain block is designated from the address data and if the certain block has been in the precharged state,
  wherein the designation of the block to be accessed is set using address data designating a block input from outside of the semiconductor memory device.

5. A clock-synchronous semiconductor memory device comprising:
  memory means comprising a plurality of memory cells arranged in a matrix, said memory cells being divided into a plurality of blocks;
  a plurality of registers used for data accessing between the memory means and an external device, which temporarily stores one part of the accessed data;
  scrambling means for selecting a part of the register used for storage of the accessed data and storing the part of accessed data;
  scrambler control means for controlling the operation of the scrambling means by which the accessed data is stored cyclically in a prescribed order in the respective registers for each cycle of the clock signal; and
  an output means for carrying out interchanges of the accessed data between the registers and the external device,
  wherein the scrambler control means sets the scrambling means to operate in the prescribed order each time a starting address for the data accessing is provided.

6. A clock-synchronous semiconductor memory device as claimed in claim 5, wherein the registers comprise a plurality of registers for input and a plurality of registers for output, the output registers being divided into register blocks of "m" groups made up of "a" registers each, with n=a×m (where m and n are positive integers) being set equal to the number of data items transferred for data access from the register blocks, and the count of the data items is stored in the registers for each "a" cycles of the clock signal, and the scrambler control means changes the state of the scrambling means each time data is stored.

7. A clock-synchronous semiconductor memory device as claimed in claim 6, wherein "a" multiplied by a time T which is required for the minimum unit of a cycle of the clock signal is set at a value equivalent to the necessary time for storing the access data from the block into the register.

8. A method for accessing a clock-synchronous semiconductor memory device comprising a plurality of memory cells arranged in matrix, wherein access of data to the memory cells is executed synchronously with an externally-provided clock signal, the memory cells are divided into at least two blocks, said method comprising the steps of:
  designating the memory cell to be accessed by row address data and column address data input from external device,
  setting the other blocks in an access preparation state or in an access operation standby state while one block is in an access operating state;
  setting a certain block in the access operating state via the access preparation state when the certain block is designated for the access operation by means of the address data and if the certain block is in the access operating state; or
  setting a certain block in the access operating state immediately when the certain block is designated for the access operation by means of the address data and if the certain block is in the access preparation state or on the access operation standby state;
  designating the memory cell in the block to be accessed by using of specified bits in the address data designating a block externally-provided from outside of the semiconductor memory device;
  storing one grouped access data temporarily into a plurality of the memory registers to carry out data access between the memory cells and the external device;

selecting the accessed data to be stored into the registers by a scrambling means;
controlling the scrambling means for the storage of accessed data cyclically in the prescribed order into the respective registers for each cycle of the clock signal by a scrambler control circuit; and
outputting and inputting interchanges of data between the registers and the external device by an output means and an input means,
wherein the scrambler control means sets the scrambling means to operate in the prescribed order each time a starting address for the data accessing is provided.

9. A method for accessing a clock-synchronous semiconductor memory device comprising a plurality of memory cells arranged in a matrix, the memory cells being divided into at least two blocks, access to the memory cells in these blocks being designated from address data provided from an external device, and access to the memory cell is executed synchronously with an externally-supplied clock signal, comprising the steps of:

setting the other blocks in an access preparation state or in an access operation standby state by indicating from outside of the semiconductor memory device while one block is in an access operating state; and
setting a certain block in the access operating state immediately when the certain block is designated for the access operation by means of the address data and if the certain block is in the access preparation state or on the access operation standby state, and setting of the designation of the memory cell in the block to be accessed using address data designating a block externally-provided from outside of the semiconductor memory device;
storing one grouped access data temporarily for carrying out data access between memory cells and an external device into a plurality of registers;
selecting the register for storing the access data by a scrambling means;
controlling the scramble means for the storage of accessed data cyclically in the prescribed order into the respective registers for each cycle of the clock signal by a scrambler control circuit; and
outputting and inputting for interchanges of data between the registers and the external device by an output means and an input means,
wherein the scrambler control means sets the scrambling means to operate in the prescribed order each time a starting address for the data accessing is provided.

* * * * *